(12) United States Patent
Park et al.

(10) Patent No.: US 8,574,819 B2
(45) Date of Patent: Nov. 5, 2013

(54) METHOD FOR FORMING FINE PATTERN

(75) Inventors: Sarohan Park, Gyeonggi-do (KR); Eun-Ha Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 199 days.

(21) Appl. No.: 12/833,833

(22) Filed: Jul. 9, 2010

(65) Prior Publication Data
US 2011/0236836 A1    Sep. 29, 2011

(30) Foreign Application Priority Data
Mar. 29, 2010   (KR) .................. 10-2010-0028175

(51) Int. Cl.
   *G03F 7/26*    (2006.01)
(52) U.S. Cl.
   USPC .......................................... 430/314
(58) Field of Classification Search
   USPC .................. 430/313, 314, 311; 216/47
   See application file for complete search history.

(56) References Cited

U.S. PATENT DOCUMENTS

| | | | |
|---|---|---|---|
| 2005/0130079 A1* | 6/2005 | Endo et al. | 430/327 |
| 2005/0142497 A1* | 6/2005 | Ryou et al. | 430/311 |
| 2007/0048674 A1* | 3/2007 | Wells | 430/313 |
| 2009/0117495 A1* | 5/2009 | Jeong | 430/323 |

FOREIGN PATENT DOCUMENTS

| | | |
|---|---|---|
| KR | 100752674 | 8/2007 |
| KR | 1020080114251 | 12/2008 |
| KR | 1020090032940 | 4/2009 |
| KR | 1020090114251 | 11/2009 |
| KR | 1020100004705 | 1/2010 |
| KR | 1020100006012 A | 1/2010 |

OTHER PUBLICATIONS

Korean Machine Translation, Jeong, KR 10-2010-0004705, Jan. 13, 2010.*
Notice of Allowance issued by the Korean Intellectual Property Office on Dec. 15, 2011.

* cited by examiner

*Primary Examiner* — Kathleen Duda
*Assistant Examiner* — Caleen Sullivan
(74) *Attorney, Agent, or Firm* — IP & T Group LLP

(57) ABSTRACT

A method includes forming a hard mask layer over an etch target layer that extends across first and second regions, forming a sacrificial layer pattern over the hard mask layer of the first region, removing the sacrificial layer pattern after forming a spacer pattern on side walls thereof, selectively etching the hard mask layer of the first region by using the spacer pattern as an etch barrier while protecting the hard mask layer of the second region from being etched, removing the spacer pattern, forming a cut mask pattern over the hard mask layer of the first and second regions, etching the hard mask layer of the first and second regions by using the cut mask pattern as an etch barrier, removing the cut mask pattern, and forming patterns in the first and second regions respectively by using the hard mask layer of the first and second regions as an etch barrier and etching the etch target layer.

23 Claims, 16 Drawing Sheets

CELL REGION | PERIPHERAL REGION

METHOD FOR FORMING FINE PATTERN

CROSS-REFERENCE TO RELATED APPLICATIONS

The present application claims priority of Korean Patent Application No. 10-2010-0028175, filed on Mar. 29, 2010, which is incorporated herein by reference in its entirety.

BACKGROUND OF THE INVENTION

Exemplary embodiments of the present invention relate to a technology for fabricating a semiconductor device, and more particularly, to a method for forming fine patterns of a semiconductor device.

As semiconductor devices become highly integrated, the line widths of patterns become narrower. However, with conventional photoresist technologies, it has become difficult to form patterns for semiconductor devices using under 40 nm process due to limitations in resolution of exposure equipment.

To address this concern, a Double Patterning Technology (DPT) process and a Spacer Patterning Technology (SPT) process may be used. The DPT process includes a Double Exposure Etch Technology (DE2T) process and a process of exposing a pattern having a period twice as wide as a target pattern period and performing an etch process.

The DE2T process may be relatively complicated due to additional processes performed with use of two masks, and the DE2T process raises a concern in that a pattern may not be properly formed when misalignment occurs between the two masks.

Thus, use of the SPT process is often desirable. Since the SPT process uses a mask process for patterning once, a concern with respect to misalignment between masks may be alleviated.

However, in using the SPT process, a process for cutting a line pattern and a process for patterning a peripheral region are used to form an isolation layer pattern that define active regions, where additional masks and additional etch and deposition processes using the additional masks are often performed.

The additional masks often add significant costs and decrease productivity in a semiconductor device fabrication process.

Therefore, a method for simplifying the SPT process to reduce production costs and increase productivity may be useful.

SUMMARY OF THE INVENTION

An embodiment of the present invention is directed to a method for forming a fine pattern that may improve the mass productivity and process margins during a Spacer Patterning Technology (SPT) process.

In accordance with an embodiment of the present invention, a method includes: forming a hard mask layer over an etch target layer that extends across a first region and a second region; forming a sacrificial layer pattern over the hard mask layer of the first region; removing the sacrificial layer pattern after forming a spacer pattern on side walls thereof; selectively etching the hard mask layer of the first region by using the spacer pattern as an etch barrier while protecting the hard mask layer of the second region from being etched; removing the spacer pattern; forming a cut mask pattern over the hard mask layer of the first and second regions; etching the hard mask layer of the first and second regions by using the cut mask pattern as an etch barrier; removing the cut mask pattern; and forming patterns in the first and second regions respectively by using the hard mask layer of the first and second regions as an etch barrier and etching the etch target layer.

The selectively etching the hard mask layer of the first region may include: forming a mask pattern over the hard mask layer of the second region, wherein the mask pattern exposes the first region; and etching the hard mask layer of the first region by using the spacer pattern and the mask pattern. The mask pattern may be a photoresist layer pattern formed by light exposure using any one light source selected from the group consisting of an I-Line light source, a KrF light source, and an ArF light source.

The forming of the hard mask layer and the sacrificial layer pattern may include: forming a sacrificial layer over the hard mask layer; forming an anti-reflection layer over the sacrificial layer; forming a first mask pattern over the anti-reflection layer of the first region; and forming the sacrificial layer pattern by using the first mask pattern as an etch barrier and etching sacrificial layer. The first mask pattern may be formed through an immersion lithography process. The hard mask layer may be a polysilicon layer or a stacked layer having a silicon oxynitride layer and a polysilicon layer that are stacked. The sacrificial layer pattern may be formed of an amorphous carbon layer or a spin-on-carbon (SOC) layer.

The spacer pattern may have an etch selectivity with respect to the sacrificial layer pattern and the hard mask layer. The spacer pattern may be an oxide layer or a nitride layer. The sacrificial layer pattern may be a photoresist layer pattern. The spacer pattern may be a low-temperature oxide layer.

The forming of the spacer pattern may include: forming an insulation layer for spacer over a profile of the structure including the sacrificial layer pattern; and etching the insulation layer for spacer in such a manner that the insulation layer for spacer remains on the sidewalls of the sacrificial layer pattern. The insulation layer for spacer may be formed through an Atomic Layer Deposition (ALD) process.

The cut mask pattern may be a photoresist layer pattern obtained by performing a patterning process based on immersion lithography. The cut mask pattern may define different patterns in the first region and the second region, respectively. The cut mask pattern may be used to etch the hard mask layer to develop a hole pattern in the first region, where the hard mask layer defines a line pattern in the second region. The line pattern may define an active region of the second region.

The method may further include: forming a planarization layer over the hard mask layer of the first and second regions, before the forming of the cut mask pattern. The planarization layer may be a spin-on-coating (SOC) layer or a spin-on-dielectric (SOD) layer. The planarization layer may be formed to be thicker than the hard mask layer. The method may further include: forming an anti-reflection layer over the planarization layer, before the forming of the cut mask pattern.

The etch target layer may be formed of an oxide layer and the oxide layer comprises a tetraethyl orthosilicate (TEOS) layer. The first region may be a cell region, and the second region may be a peripheral region.

DESCRIPTION OF SPECIFIC EMBODIMENTS

Figure 1A:
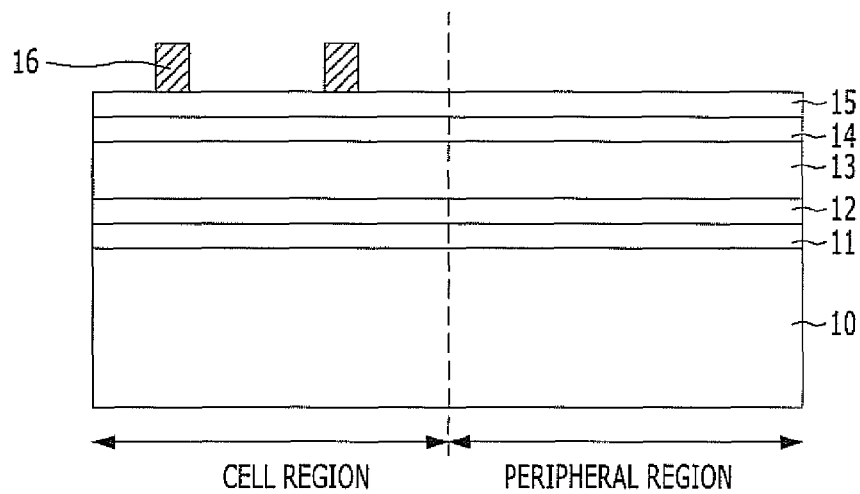
FIGS. 1A, 1C, 1E, 1G, 1I, 1K, 1M, and 1O are cross-sectional views illustrating a method for forming a fine pattern in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals shown in like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

A Spacer Patterning Technology (SPT) process includes a positive SPT process and a negative SPT process. The positive SPT process uses a spacer pattern as a hard mask for a patterning process, while the negative SPT process fills the space between spacer patterns with an insulation material and uses the insulation material filling the space between the spacer patterns as a hard mask after removing the spacer patterns.

With the negative SPT process, the mask process using a spacer pattern as a hard mask may be avoided, but due to low final line critical dimension uniformity, the critical dimension uniformity (CDU) of an active region may be deteriorated. Therefore, according to exemplary embodiments, the positive SPT process are applied to improve the CDU.

1$^{st}$ Embodiment

FIGS. 1A, 1C, 1E, 1G, 1I, 1K, 1M, and 1O are cross-sectional views along line A-A' of semiconductor structures in FIGS. 1B, 1D, 1F, 1H, 1J, 1L, 1N, and 1P, respectively, and illustrate a method for forming a fine pattern in accordance with a first embodiment of the present invention. FIGS. 1B, 1D, 1F, 1H, 1J, 1L, 1N, and 1P are plan views illustrating a method for forming a fine pattern in accordance with the first embodiment of the present invention.

Figure 1B:
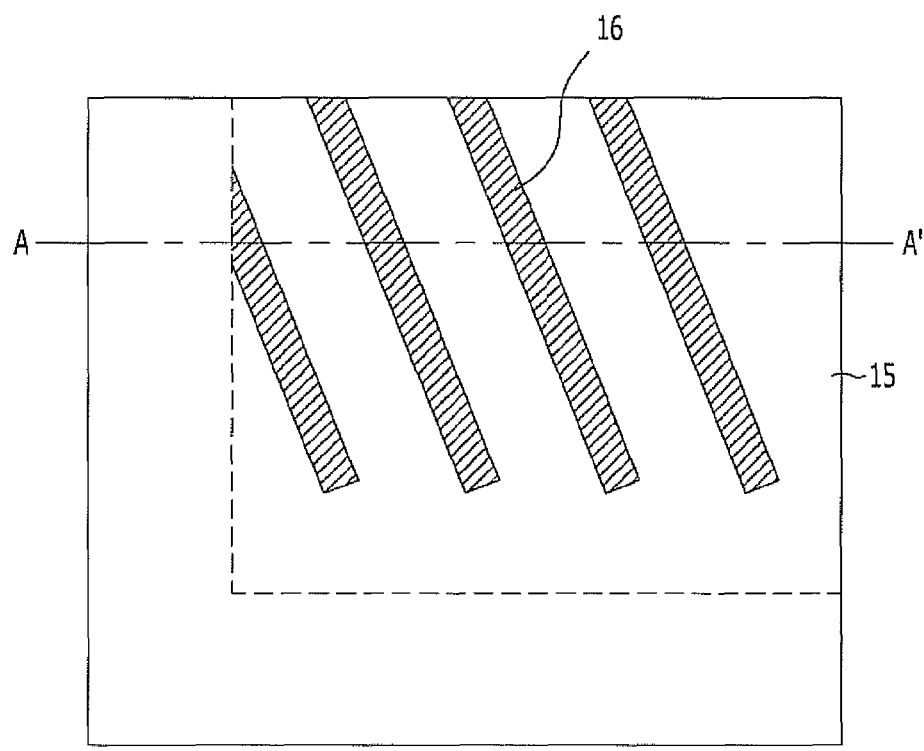
FIGS. 1B, 1D, 1F, 1H, 1J, 1L, 1N, and 1P are plan views illustrating a method for forming a fine pattern in accordance with the first embodiment of the present invention.

Referring to FIGS. 1A and 1B, a hard mask layer is formed over an etch target layer 10 which includes a first region and a second region. The first region may be a cell region, and the second region may be a peripheral region. Hereafter, according to an example, the first region is cell region and the second region is a peripheral region. The peripheral region includes a core region where a sub-word line or a sense amplifier may be disposed adjacent to the cell region.

Although not illustrated, the etch target layer 10 serves as a hard mask used for etching a substrate under the etch target layer 10. The etch target layer 10 may be formed of an oxide layer. For example, the etch target layer 10 may be a tetraethyl orthosilicate (TEOS) layer.

The hard mask layer is formed for etching the etch target layer 10. The hard mask layer may be formed to have a single structure of a polysilicon layer 12 or a stacked structure where a silicon oxynitride layer 11 and a polysilicon layer 12 are stacked. In this embodiment of the present invention, the hard mask layer has a stacked structure of the silicon oxynitride layer 11 and the polysilicon layer 12.

Subsequently, a sacrificial layer 13 is formed over the polysilicon layer 12. The sacrificial layer 13 is used as a sacrificial layer pattern for forming a spacer pattern in a subsequent process. The sacrificial layer 13 is formed of a material that may be easily removed. The sacrificial layer 13 may be amorphous carbon or spin-on-carbon (SOC) layer.

Subsequently, a silicon oxynitride layer 14 and a first anti-reflection layer 15 are stacked. The silicon oxynitride layer 14 may be used as a hard mask and the silicon oxynitride layer 14 functions as an anti-reflection layer when a photoresist layer pattern is formed in a subsequent process, along with a first anti-reflection layer 15.

Subsequently, a first photoresist layer pattern 16 is formed over the first anti-reflection layer 15 of the cell region. The first photoresist layer pattern 16 defines a sacrificial layer pattern needed to form a spacer for a subsequent Spacer Patterning Technology (SPT) process. Thus, since the line width between sacrificial layer patterns is wide, exposure margins may be secured. In forming the first photoresist layer pattern 16, immersion lithography may be performed.

Figure 1C:
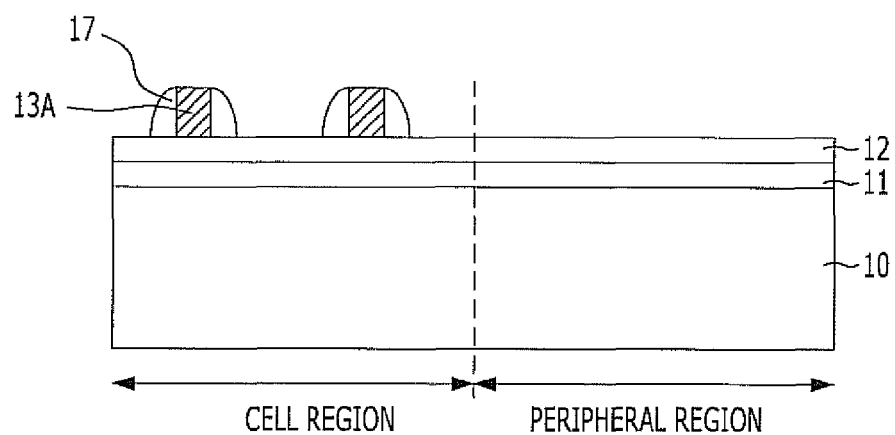
Figure 1D:
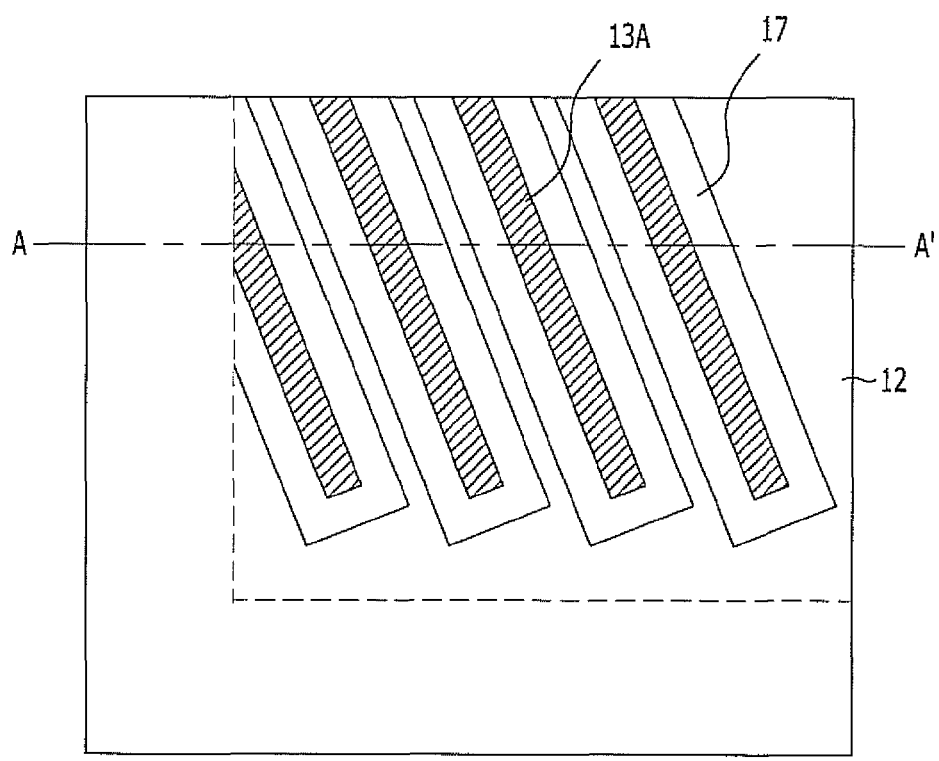

Referring to FIGS. 1C and 1D, the first anti-reflection layer 15 (shown in FIGS. 1A and 1B) and the silicon oxynitride layer 14 (shown in FIGS. 1A and 1B) are etched using the first photoresist layer pattern 16 (shown in FIGS. 1A and 1B) as an etch barrier.

Subsequently, a sacrificial layer pattern 13A is formed by etching the sacrificial layer 13. Since the first photoresist layer pattern 16 is formed in the cell region, the sacrificial layer pattern 13A is formed in the cell region as well. The silicon oxynitride layer 14 (shown in FIGS. 1A and 1B), the first anti-reflection layer 15 (shown in FIGS. 1A and 1B), and the first photoresist layer pattern 16 over the sacrificial layer pattern 13A may be all removed at the same time that the sacrificial layer pattern 13A is formed, or they may be removed through a dry etch process after the formation of the sacrificial layer pattern 13A.

Subsequently, a spacer pattern 17 is formed on the side-walls of the sacrificial layer pattern 13A. In order to form the spacer pattern 17, first, an insulation layer for spacer is formed over the profile of the substrate structure including the sacrificial layer pattern 13A. The insulation layer for spacer is a layer for forming the spacer pattern 17 and the insulation layer for spacer may be formed of a material having an etch selectivity with respect to the polysilicon layer 12 in the lower portion of the substrate structure and the sacrificial layer pattern 13A. For example, the insulation layer for spacer may include an oxide layer or a nitride layer. Also, the insulation layer for spacer may be formed to have a high step coverage to form a pattern of a uniform line width. For the high step coverage, the insulation layer for spacer may be formed using Atomic Layer Deposition (ALD) process.

Subsequently, the spacer pattern 17 remains on the side-walls of the sacrificial layer pattern 13A by etching the insulation layer for spacer. The insulation layer for spacer may be etched through an etch-back process, and it is etched targeting to open the upper portion of the sacrificial layer pattern 13A and the surface of the polysilicon layer 12.

Referring to a plan view of the substrate structure in FIG. 1D, since the spacer pattern 17 remains on the sidewalls of the sacrificial layer pattern 13A, the ends of the spacer pattern 17 are connected to each other.

Figure 1E:
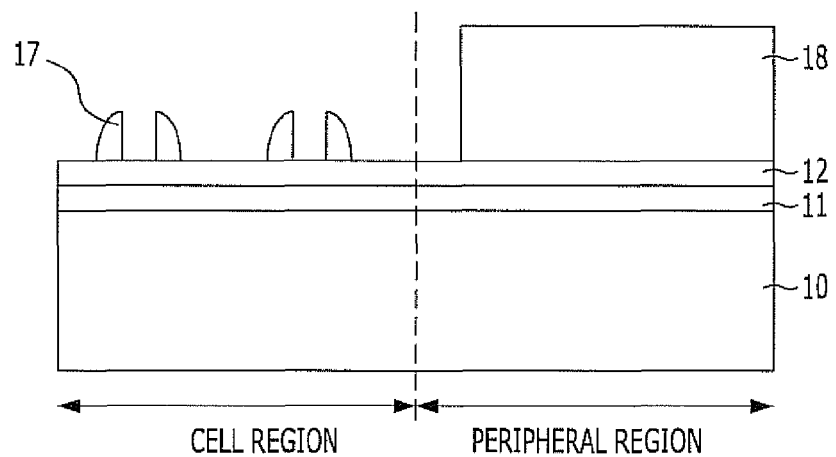
Figure 1F:
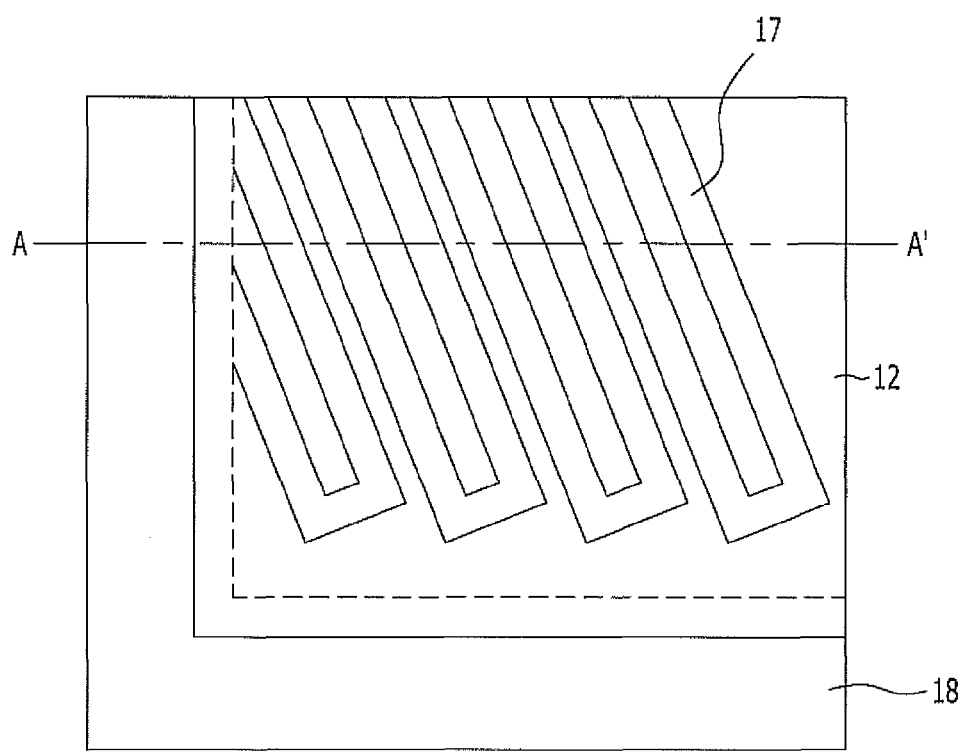

Referring to FIGS. 1E and 1F, the sacrificial layer pattern 13A is removed. The sacrificial layer pattern 13A is removed through an etch-back process. The sacrificial layer pattern 13A may also be removed by using any other reasonably suitable method including using oxygen plasma.

As a result, spacer patterns 17 spaced apart from each other by a predetermined space are formed in the upper portion of the polysilicon layer 12 of the cell region.

Subsequently, a second photoresist layer pattern 18 opening the cell region is formed over the polysilicon layer 12 of the peripheral region. The second photoresist layer pattern 18 is a cell open mask pattern for selectively etching the cell region. The second photoresist layer pattern 18 is formed to protect the peripheral region. To this end, the second photoresist layer pattern 18 is formed by coating the substrate structure including the spacer pattern 17 with a photoresist layer, and then patterning the photoresist layer to open the cell region through exposure and development processes. The second photoresist layer pattern 18 may be formed of a photoresist layer and formed by light exposure using any one selected from the group consisting of an I-Line light source, a KrF light source, and an ArF light source as a light source. According to an example, the photoresist layer may be formed using I-Line as a light source.

Referring to FIG. 1F, the second photoresist layer pattern 18 is selectively formed in the peripheral region outside the cell region where the spacer pattern 17 is formed.

Figure 1G:
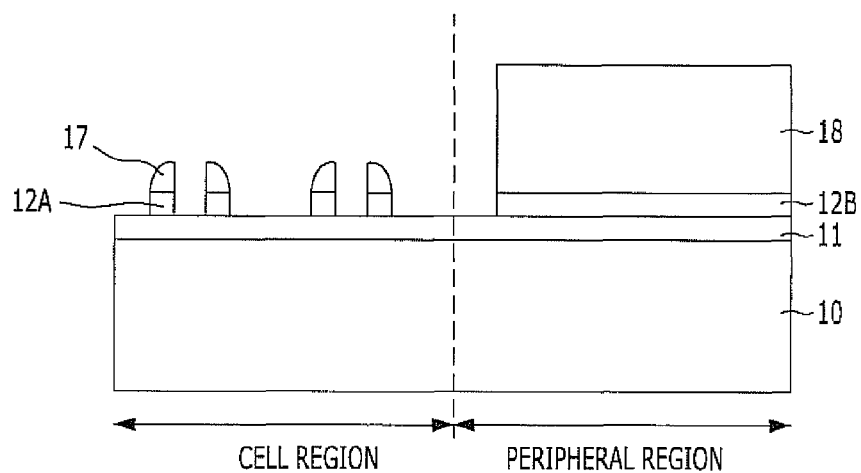
Figure 1H:
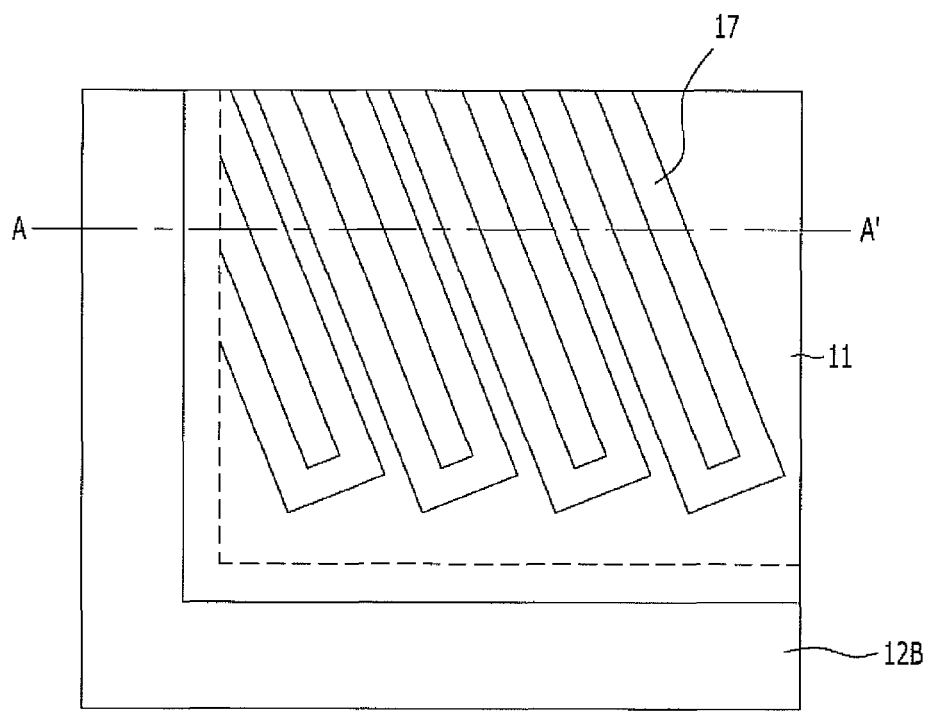

Referring to FIGS. 1G and 1H, the polysilicon layer 12 (shown in FIGS. 1E and 1F) is etched using the spacer pattern 17 (shown in FIGS. 1E and 1F) and the second photoresist layer pattern 18 as etch barriers. Herein, the etch process may be performed using a silicon etchant gas in such a manner that the silicon oxynitride layer 11 in the lower portion of the substrate structure is not etched and the polysilicon layer 12 (shown in FIGS. 1E and 1F) in areas other than areas covered by the spacer pattern 17 and the second photoresist layer pattern 18 is selectively etched.

As a result, polysilicon layer patterns 12A and 12B are formed in the cell region and the peripheral region, respectively. The polysilicon layer pattern 12A in the cell region may be formed to be twice a device pitch. The polysilicon layer pattern 12B in the peripheral region is a portion of the polysilicon layer 12 (shown in FIGS. 1E and 19 protected by the second photoresist layer pattern 18 from being etched and remaining in the peripheral region.

As described above, in the process for forming the polysilicon layer pattern 12A in the cell region, since the polysilicon layer pattern 12B in the peripheral region is not exposed to light due to the presence of the second photoresist layer pattern 18, which operates as a cell open mask and remains, both of the polysilicon layer pattern 12A in the cell region and the polysilicon layer pattern 12B in the peripheral region may be used as etch barriers in a subsequent etch process.

Also, since an additional process for forming a pattern in the peripheral region, such as layer deposition, is not performed, process margins may be secured. Moreover, since the polysilicon layer pattern 12A in the cell region and the polysilicon layer pattern 12B in the peripheral region are basically of the same material, they have the same etch characteristics, which facilitate an etch process.

Figure 1I:
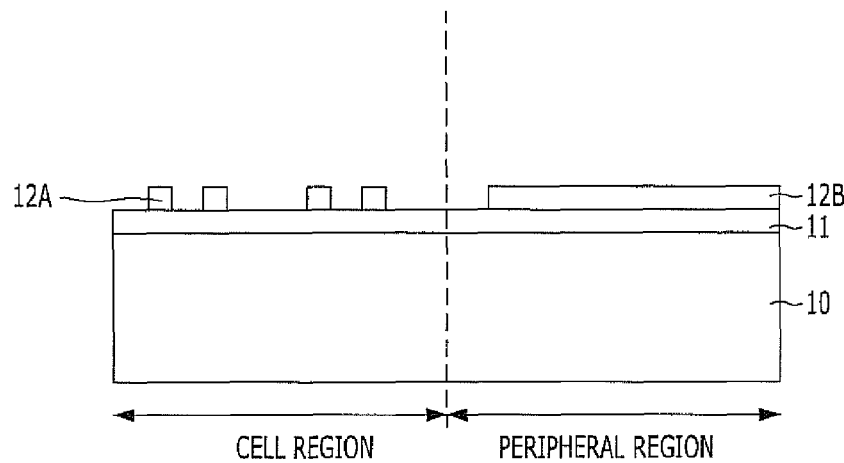
Figure 1J:
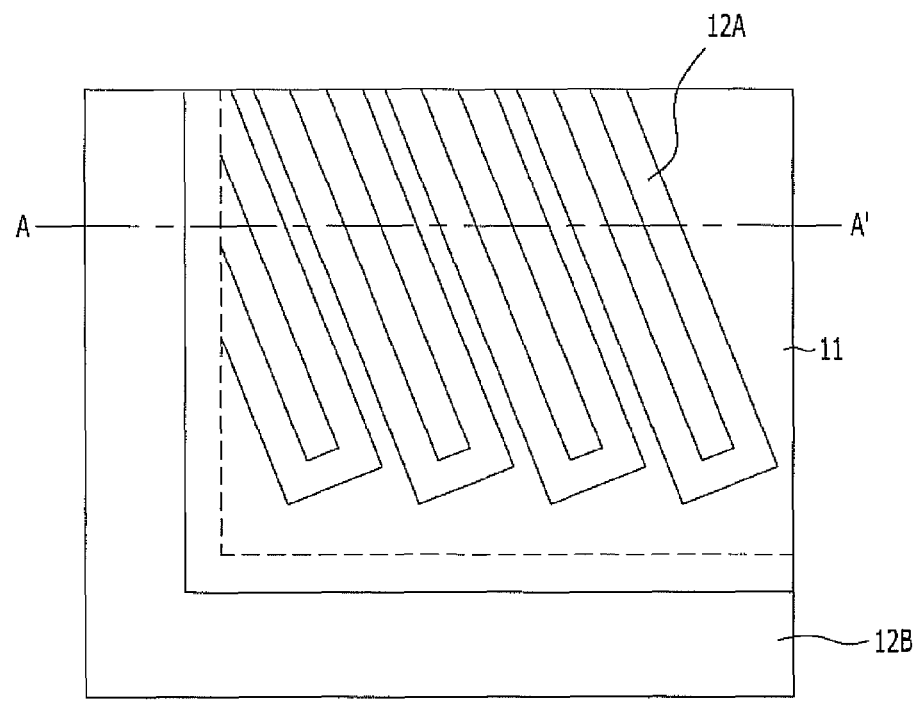

Referring to FIGS. 1I and 1J, the spacer pattern 17 (shown in FIGS. 1G and 1H) is removed. The spacer pattern 17 (shown in FIGS. 1G and 1H) may be removed through a dry etch process, a wet etch process, or any other reasonably suitable etch process. The process of removing the spacer pattern 17 (shown in FIGS. 1G and 1H) may be performed in such a manner that the polysilicon patterns 12A and 12B and the silicon oxynitride layer 11 in the lower portion are not damaged.

Subsequently, the second photoresist layer pattern 18 (shown in FIGS. 1G and 1H) is removed. The second photoresist layer pattern 18 (shown in FIGS. 1G and 1H) may be removed through a dry etch process. The dry etch process may be an oxygen stripping process. According to an exemplary embodiment of the present invention, the second photoresist layer pattern 18 (shown in FIGS. 1G and 1H) is removed after the spacer pattern 17 (shown in FIGS. 1G and 1H) is removed. However, according to another exemplary embodiment, the spacer pattern 17 (shown in FIGS. 1G and 1H) may be removed after the second photoresist layer pattern 18 (shown in FIGS. 1G and 1H) is removed.

As described above, the polysilicon layer pattern 12A in the cell region etched with the same line width and gap as the spacer pattern 17 (shown in FIGS. 1G and 1H) and the polysilicon layer pattern 12B in the peripheral region protected from being etched by the second photoresist layer pattern 18 (shown in FIGS. 1G and 1H) remain in the uppermost layer. Thus, the cell region and the peripheral region use the same polysilicon as a hard mask (i.e., 12A and 12B) and come to have substantially the same etch characteristics during a subsequent process for forming an isolation layer, where the substantially the same etch characteristics facilitate the etch process.

In particular, because the asymmetrical spacer pattern 17 (shown in FIGS. 1G and 1H) at the right and left sides of the space previously occupied by a sacrificial layer pattern is removed in advance before a subsequent etch process, a pattern of a normal profile may be secured in the subsequent etch process. As a result, concerns regarding misalignment and pattern failure may be improved.

Figure 1K:
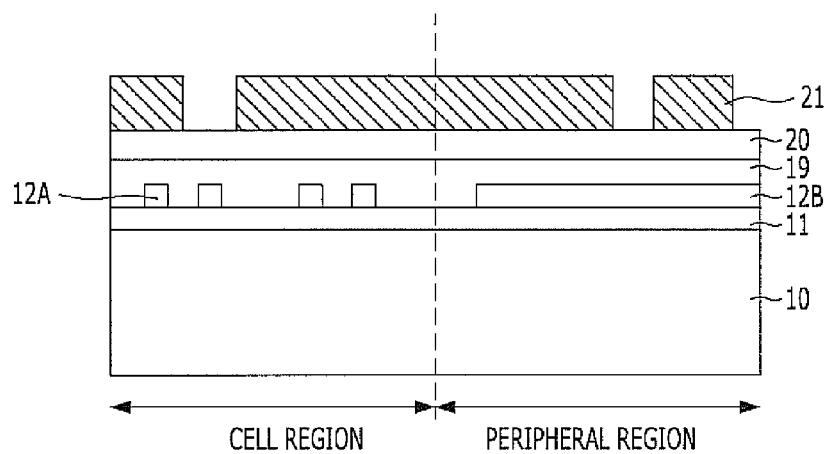
Figure 1L:
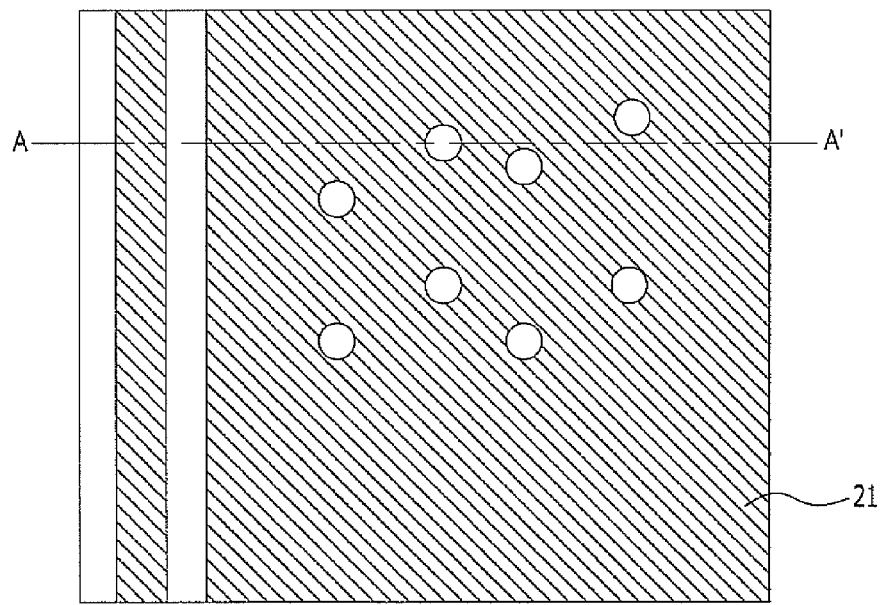

Referring to FIGS. 1K and 1L, a planarization layer 19 may be formed over the substrate structure including the polysilicon patterns 12A and 12B. The planarization layer 19 is formed to planarize the profile of the cell region which includes step heights obtained from patterning. The planarization layer 19 may be formed of any reasonably suitable material for planarization. For example, the planarization layer 19 may be formed of a spin-on-coating (SOC) layer or a spin-on-dielectric (SOD) layer. Particularly, the planarization layer 19 may be formed thicker than the polysilicon layer pattern 32B so as to sufficiently planarize the profile.

Subsequently, a second anti-reflection layer 20 is formed over the planarization layer 19. The second anti-reflection layer 20 may be a silicon anti-reflection coating layer (Si-ARC) which includes silicon and functions as a hard mask, or an anti-reflection layer.

According to another embodiment, the second anti-reflection layer 20 may be directly formed over the polysilicon patterns 12A and 12B without forming the planarization layer 19 so that the second anti-reflection layer 20 functions as a planarization layer.

Subsequently, a third photoresist layer pattern 21 is formed over the second anti-reflection layer 20. The third photoresist layer pattern 21 is a cut mask pattern which cuts the polysilicon layer pattern 12A in the cell region so that the polysilicon patterns 12A and 12B define active regions in both the cell region and the peripheral region. As illustrated in the plan view of FIG. 1L, the third photoresist layer pattern 21 is formed to open a contact hole pattern in the cell region and define pattern in a line type in the peripheral region. Herein, since the third photoresist layer pattern 21 creates contact holes in the polysilicon layer pattern 12A at the cell region, where the third photoresist layer pattern is formed in a line type and define the active regions, the upper portion of the polysilicon layer pattern 12A in the cell region and an open region of the contact hole pattern may overlap.

In forming the third photoresist layer pattern 21, an immersion lithography process may be performed.

Figure 1M:
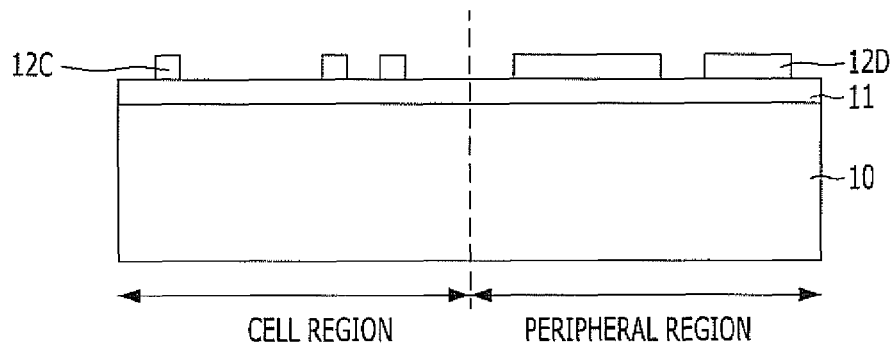
Figure 1N:
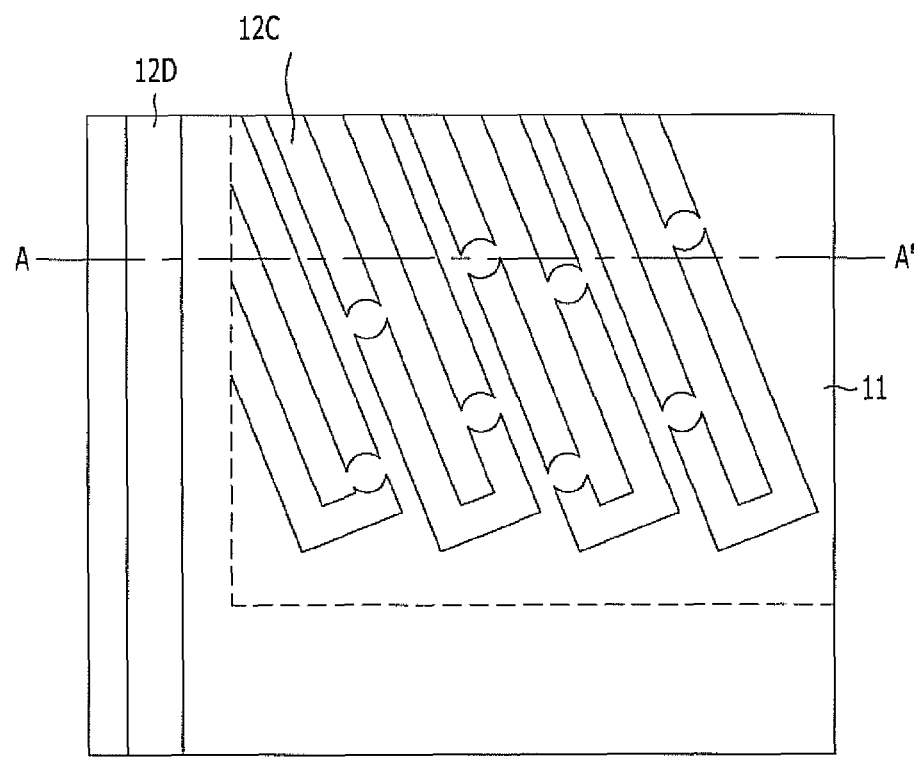

Referring to FIGS. 1M and 1N, the second anti-reflection layer 20 (shown in FIGS. 1K and 1L) and the planarization layer 19 (shown in FIGS. 1K and 1L) are etched using the third photoresist layer pattern 21 (shown in FIGS. 1K and 1L) as an etch barrier.

Subsequently, final polysilicon patterns 12C and 12D are formed by etching the polysilicon layer pattern 12A (shown in FIGS. 1K and 1L) in the cell region and the polysilicon layer pattern 12B (shown in FIGS. 1K and 1L) in the peripheral region.

As illustrated in FIG. 1N, which is a plan view, the final polysilicon pattern 12C in the cell region is divided by the third photoresist layer pattern 21 (shown in FIGS. 1K and 1L) so as to define active regions, and the final polysilicon pattern 12D in the peripheral region also defines active regions for forming an isolation layer.

Figure 1O:
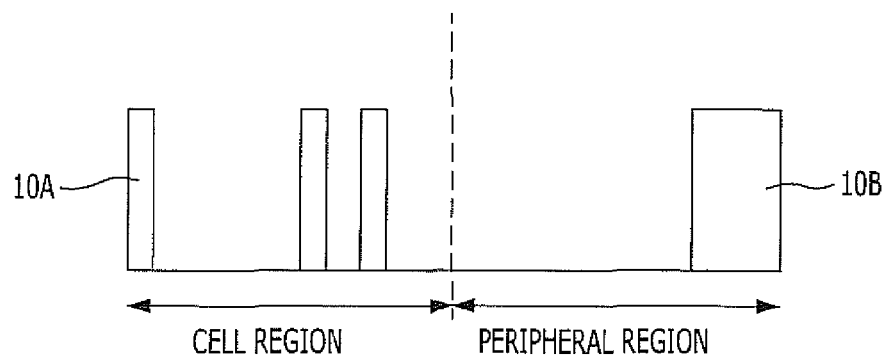
Figure 1P:
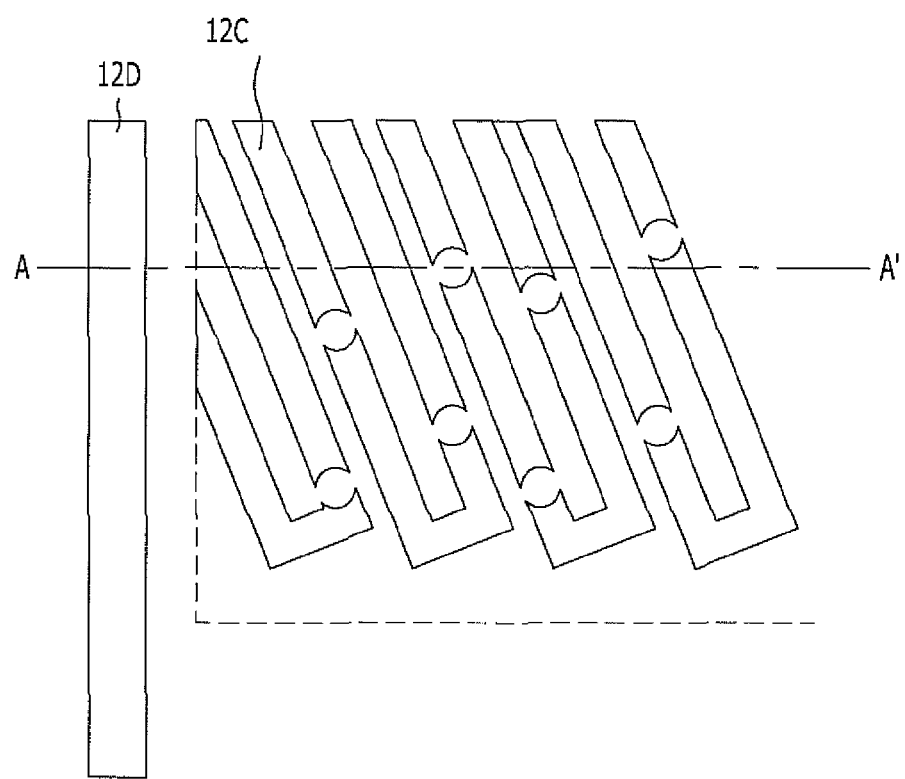

Referring to FIGS. 1O and 1P, the silicon oxynitride layer 11 (shown in FIGS. 1M and 1N) and the etch target layer 10 (shown in FIGS. 1M and 1N) are etched using the final polysilicon patterns 12C and 12D (shown in FIGS. 1M and 1N) as etch barriers so as to form patterns 10A and 10B which define active regions in the cell region and the peripheral region.

While performing the SPT process described above, since the patterning through immersion lithography is performed in two out of three processes for forming a photoresist layer, the process margins and mass productivity may be improved. Also, through the positive SPT process, a concern regarding Critical Dimension Uniformity (CDU) failure occurring from a negative SPT process may be alleviated at the same time.

2$^{nd}$ Embodiment

FIGS. 2A, 2C, 2E, 2G, 2I, 2K, 2M, and 2O are cross-sectional views along line B-B' of semiconductor structures in FIGS. 2B, 2D, 2F, 2H, 2J, 2L, 2N, and 2P, respectively, and illustrate a method for forming a fine pattern in accordance with a second embodiment of the present invention. FIGS. 2B, 2D, 2F, 2H, 2J, 2L, 2N, and 2P are plan views illustrating a method for forming a fine pattern in accordance with the second embodiment of the present invention. [The foregoing designation of a line along which cross-sectional views are taken and corresponding depicture of the line in figures seem desirable, especially in view of FIGS. 2K and 2L where FIG. 2K seems to show a straight line etched across mask 39 at the cell region in contrast to FIG. 2L which shows circular openings in the mask 39 at the cell region.]

Figure 2A:
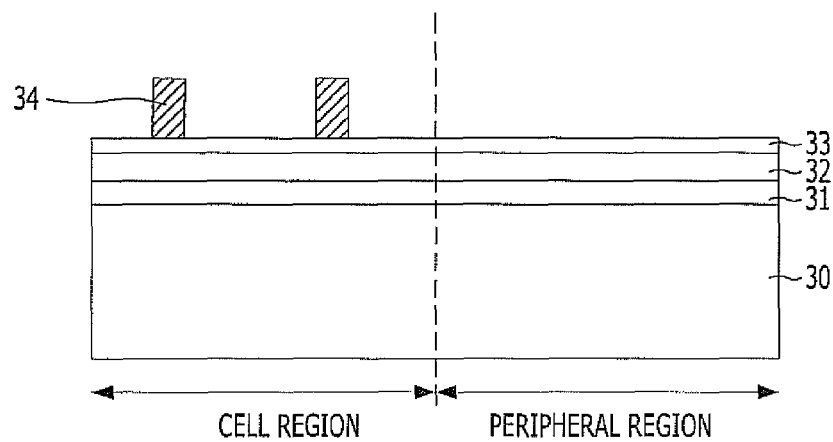
FIGS. 2A, 2C, 2E, 2G, 2I, 2K, 2M, and 2O are cross-sectional views illustrating a method for forming a fine pattern in accordance with a second embodiment of the present invention.
Figure 2B:
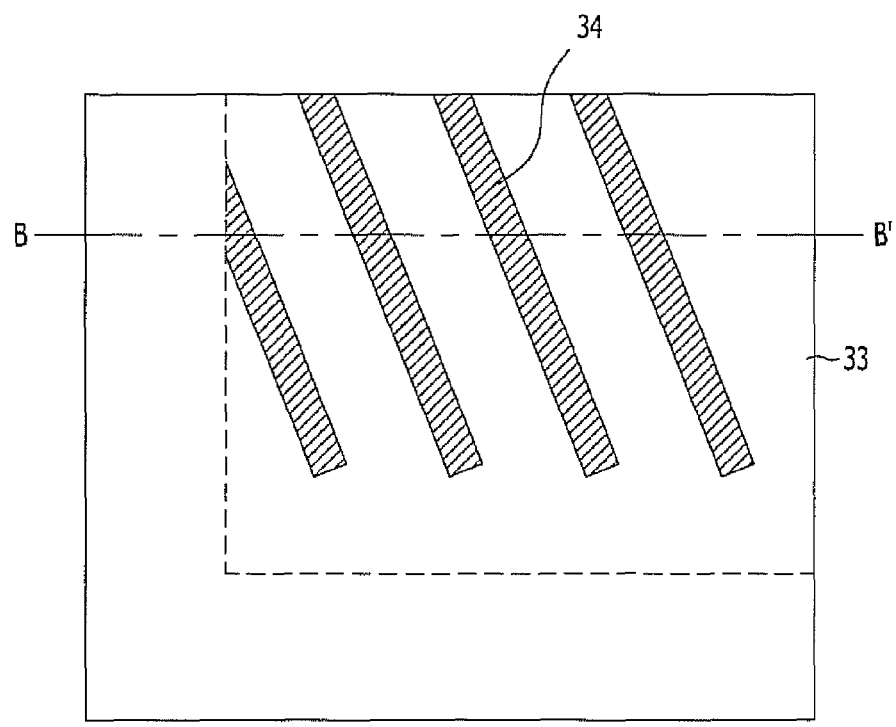
FIGS. 2B, 2D, 2F, 2H, 2J, 2L, 2N, and 2P are plan views illustrating a method for forming a fine pattern in accordance with the second embodiment of the present invention.

Referring to FIGS. 2A and 2B, a hard mask layer is formed over an etch target layer 30 which includes a first region and a second region. The first region may be a cell region, and the second region may be a peripheral region. Hereafter, according to an example, the first region is cell region and the second region is a peripheral region. The peripheral region includes a core region where a sub-word line or a sense amplifier may be disposed adjacent to the cell region.

Although not illustrated, the etch target layer 30 serves as a hard mask used for etching a substrate under the etch target layer 30. The etch target layer 30 may be formed of an oxide layer. For example, the etch target layer 30 may be a tetraethyl orthosilicate (TEOS) layer.

The hard mask layer is formed for etching the etch target layer 30. The hard mask layer may be formed to have a single structure of a polysilicon layer 32 or a stacked structure where a silicon oxynitride layer 31 and a polysilicon layer 32 are stacked. In this embodiment of the present invention, the hard mask layer has a stacked structure of the silicon oxynitride layer 31 and the polysilicon layer 32.

Subsequently, a first anti-reflection layer 33 is formed over the polysilicon layer 32.

Subsequently, a first photoresist layer pattern 34 is formed over the first anti-reflection layer 33 of the cell region. The first photoresist layer pattern 34 is used as a sacrificial layer pattern for forming a spacer used for a subsequent Spacer Patterning Technology (SPT) process. Hereafter, the first photoresist layer pattern 34 is referred to as a sacrificial layer pattern 34. Since the sacrificial layer pattern 34 has wide line widths between patterns, exposure margins may be secured. In forming the sacrificial layer pattern 34, immersion lithography may be performed.

Figure 2C:
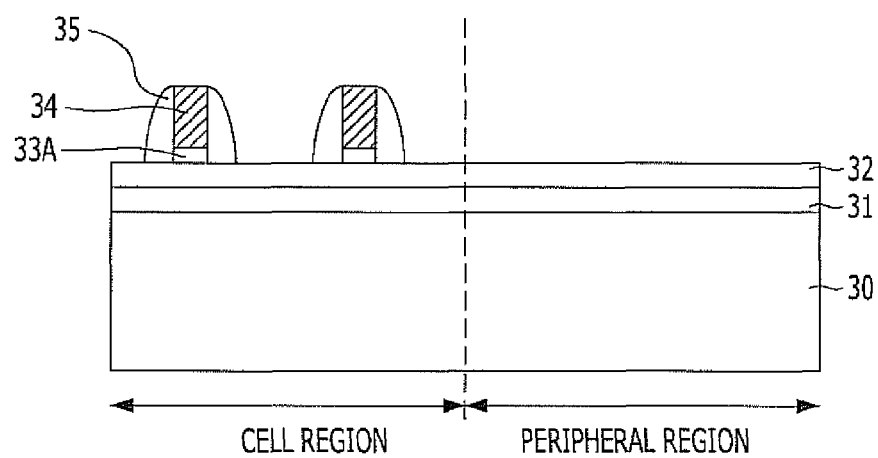
Figure 2D:
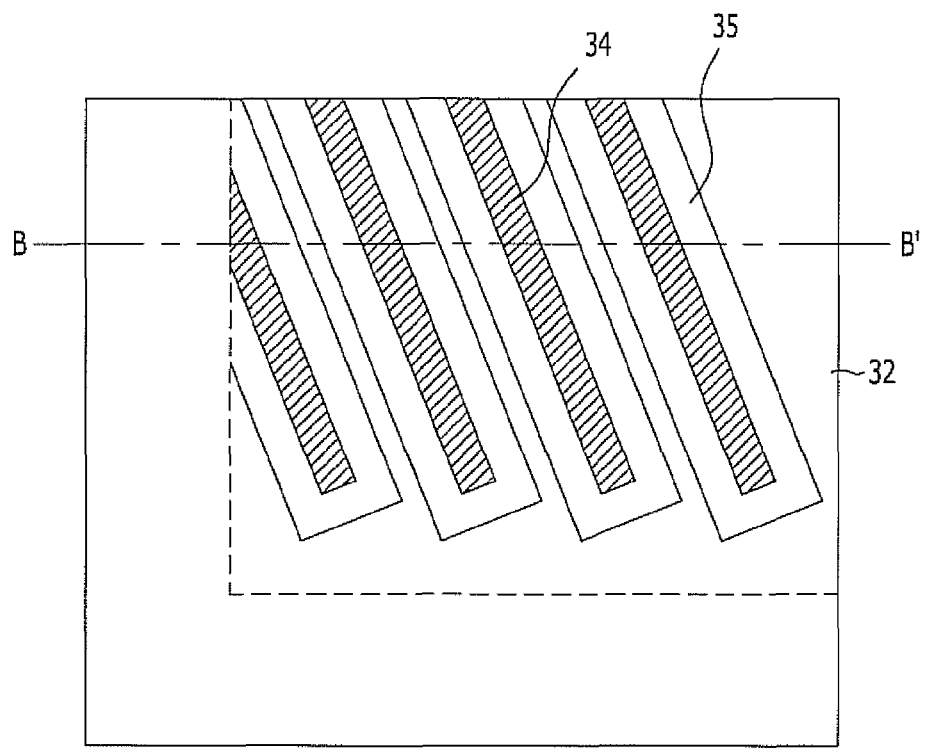

Referring to FIGS. 2C and 2D, a first anti-reflection layer pattern 33A is formed by etching the first anti-reflection layer 33 (shown in FIGS. 2A and 2B) using the sacrificial layer pattern 34 (shown in FIGS. 2A and 2B) as an etch barrier.

Subsequently, a spacer pattern 35 is formed on the sidewalls of the first anti-reflection layer pattern 33A and the sacrificial layer pattern 34. In order to form the spacer pattern 35, first, an insulation layer for spacer is formed over the profile of the substrate structure including the sacrificial layer pattern 34. The insulation layer for spacer is a layer for forming the spacer pattern 35 and the insulation layer for spacer may be formed of a low-temperature oxide layer deposited at a temperature lower than the baking temperature of a photoresist layer to protect the photoresist layer used as the sacrificial layer pattern 34 from being deformed. For high step coverage, the insulation layer for spacer may be formed based on Atomic Layer Deposition (ALD) process.

Subsequently, the spacer pattern 35 remains on the sidewalls of the sacrificial layer pattern 34 by etching the insulation layer for spacer. The insulation layer for spacer may be etched through an etch-back process in order to open the upper portion of the sacrificial layer pattern 34 and the lower surface of the polysilicon layer 32 other than the sacrificial layer pattern 34 on the sidewalls of the sacrificial layer pattern 34 and the first anti-reflection layer pattern 33a.

Referring to FIG. 2D, which is a plan view, since the spacer pattern 35 remains on the sidewalls of the first anti-reflection layer pattern 33A and the sacrificial layer pattern 34, the ends of the spacer pattern 35 are connected to each other.

Figure 2E:
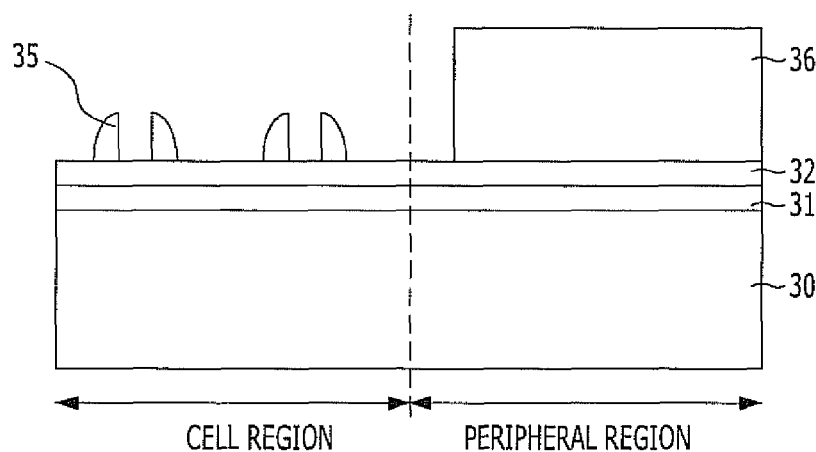
Figure 2F:
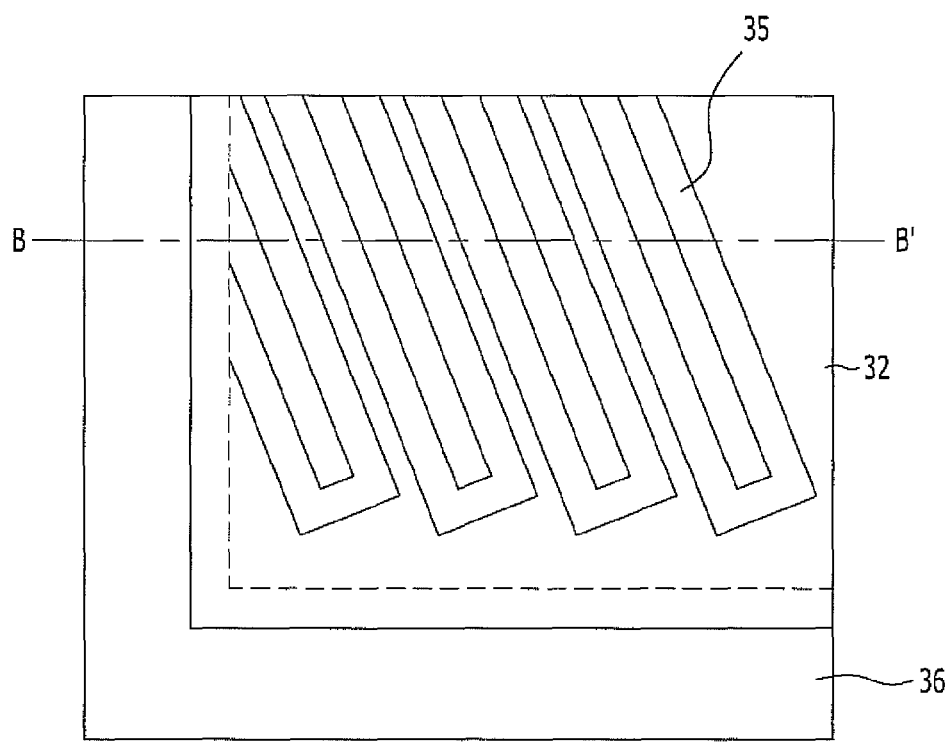

Referring to FIGS. 2E and 2F, the sacrificial layer pattern 34 is removed. The sacrificial layer pattern 34 is removed through an etch-back process. The sacrificial layer pattern 34 may also be removed using any other reasonably suitable process including using oxygen plasma. When the sacrificial layer pattern 34 is removed, the first anti-reflection layer pattern 33A may be removed as well.

As a result, according to an example, spacer patterns 35 spaced apart from each other by a predetermined space are formed in the upper portion of the polysilicon layer 32 of the cell region.

Subsequently, a second photoresist layer pattern 36 opening the cell region is formed over the polysilicon layer 32 of the peripheral region. The second photoresist layer pattern 36 is a cell open mask pattern for selectively etching the cell region. The second photoresist layer pattern 36 is formed to protect the peripheral region. To this end, the second photoresist layer pattern 36 is formed by coating the substrate structure including the spacer pattern 35 with a photoresist layer, and then patterning the photoresist layer to open the cell region through exposure and development processes. The second photoresist layer pattern 36 may be formed of a photoresist layer and formed by light exposure using any one selected from the group consisting of an I-Line light source, a KrF light source, and an ArF light source as a light source. According to an example, the photoresist layer may be formed using I-Line as a light source.

Referring to FIG. 2F, the second photoresist layer pattern 36 is selectively formed in the peripheral region outside the cell region where the spacer pattern 35 is formed.

Figure 2G:
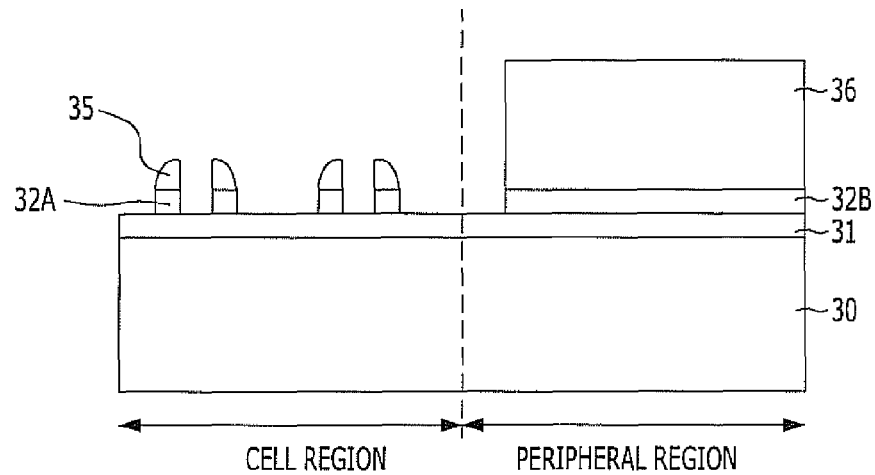
Figure 2H:
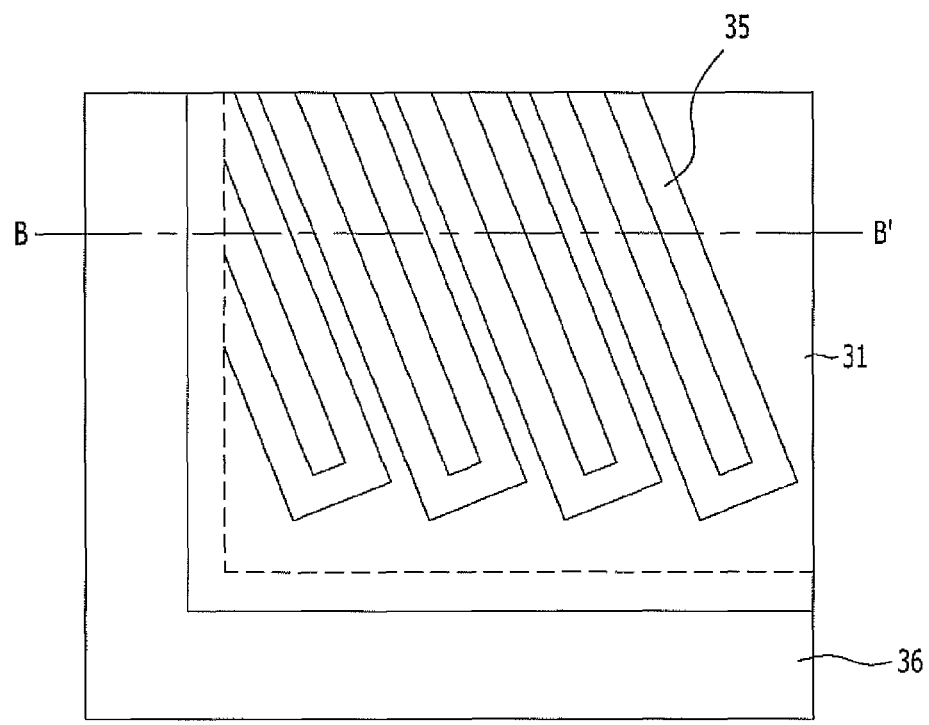

Referring to FIGS. 2G and 2H, the polysilicon layer 32 in FIGS. 2E and 2F is etched using the spacer pattern 35 in FIGS. 2E and 2F and the second photoresist layer pattern 36 as etch barriers. Herein, the etch process may be performed using a silicon etchant gas in such a manner that the silicon oxynitride layer 31 in the lower portion of the substrate structure is not etched and the polysilicon layer 32 (shown in FIGS. 2E and 2F) is selectively etched.

As a result, polysilicon layer patterns 32A and 32B are formed in the cell region and the peripheral region, respectively. The polysilicon layer pattern 32A in the cell region may be formed to be twice a device pitch. The polysilicon layer pattern 32B in the peripheral region is a portion of the polysilicon layer 32 (shown in FIGS. 2E and 2F) protected by the second photoresist layer pattern 36 from being etched and remaining in the peripheral region.

As described above, in the process for forming the polysilicon layer pattern 32A in the cell region, since the polysilicon layer pattern 32B in the peripheral region is not exposed to light due to the presence of the second photoresist layer pattern 36, which operates as a cell open mask and remains, both of the polysilicon layer pattern 32A in the cell region and the polysilicon layer pattern 32B in the peripheral region may be used as etch barriers in a subsequent etch process.

Also, since an additional process for forming a pattern in the peripheral region, such as layer deposition, is not performed, process margins may be secured. Moreover, since the polysilicon layer pattern 32A in the cell region and the polysilicon layer pattern 32B in the peripheral region are basically of the same material, they have the same etch characteristics, which facilitate an etch process.

Figure 2I:
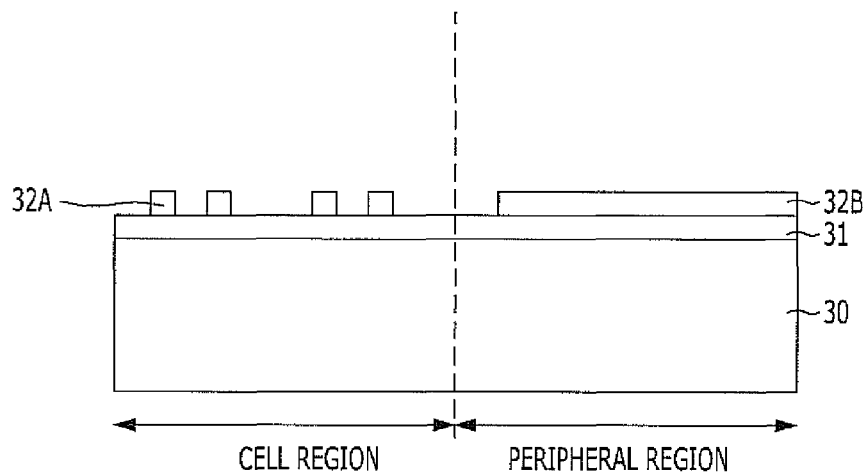
Figure 2J:
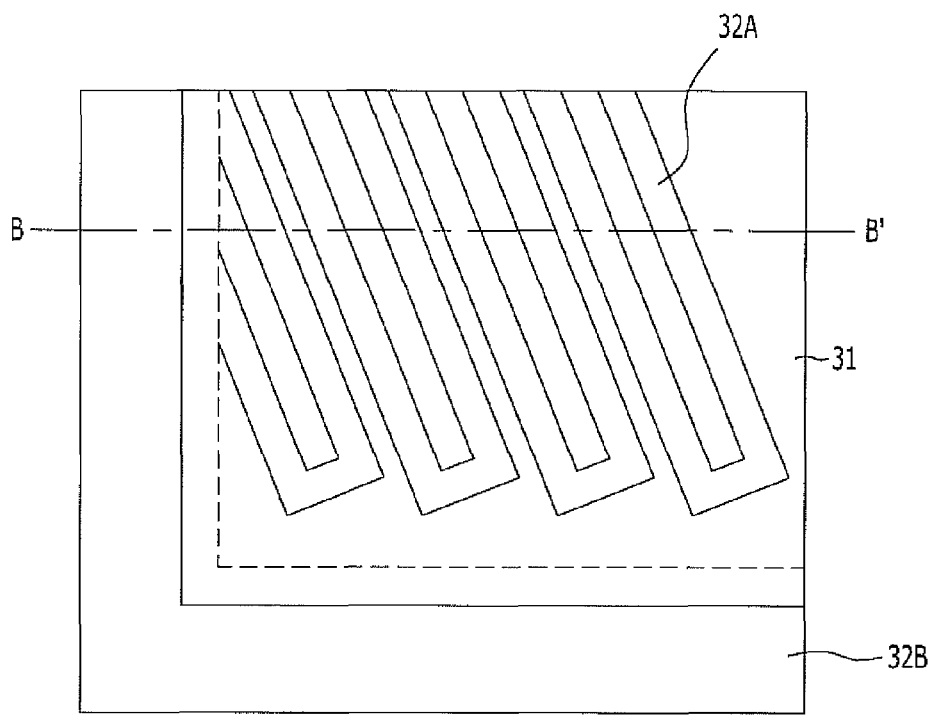

Referring to FIGS. 2I and 2J, the spacer pattern 35 (shown in FIGS. 2G and 2H) is removed. The spacer pattern 35 (shown in FIGS. 2G and 2H) may be removed through a dry etch process, a wet etch process, or any other reasonably suitable etch process. The process of removing the spacer pattern 35 (shown in FIGS. 2G and 2H) may be performed in such a manner that the polysilicon patterns 32A and 32B and the silicon oxynitride layer 31 in the lower portion are not damaged.

Subsequently, the second photoresist layer pattern 36 (shown in FIGS. 2G and 2H) is removed. The second photoresist layer pattern 36 (shown in FIGS. 2G and 2H) may be removed through a dry etch process. The dry etch process may be an oxygen stripping process. According to an exemplary embodiment of the present invention, the second photoresist layer pattern 36 (shown in FIGS. 2G and 2H) is removed after the spacer pattern 35 (shown in FIGS. 2G and 2H) is removed. However, according to another exemplary embodiment, the spacer pattern 35 (shown in FIGS. 2G and 2H) may be removed after the second photoresist layer pattern 36 (shown in FIGS. 2G and 2H) is removed.

As described above, the polysilicon layer pattern 32A in the cell region etched with the same line width and gap as the spacer pattern 35 (shown in FIGS. 2G and 2H) and the polysilicon layer pattern 32B in the peripheral region protected from being etched by the second photoresist layer pattern 36 (shown in FIGS. 2G and 2H) remain in the uppermost layer. Thus, the cell region and the peripheral region use the same polysilicon as a hard mask (i.e., 32A and 32B) and come to have substantially the same etch characteristics during a subsequent process for forming an isolation layer, where the substantially the same etch characteristics facilitate the etch process.

In particular, because the asymmetrical spacer pattern 35 (shown in FIGS. 2G and 2H) at the right and left sides of the space previously occupied by a sacrificial layer pattern is removed in advance before a subsequent etch process, a pattern of a normal profile may be secured in the subsequent etch process. As a result, concerns regarding misalignment and pattern failure may be alleviated.

Figure 2K:
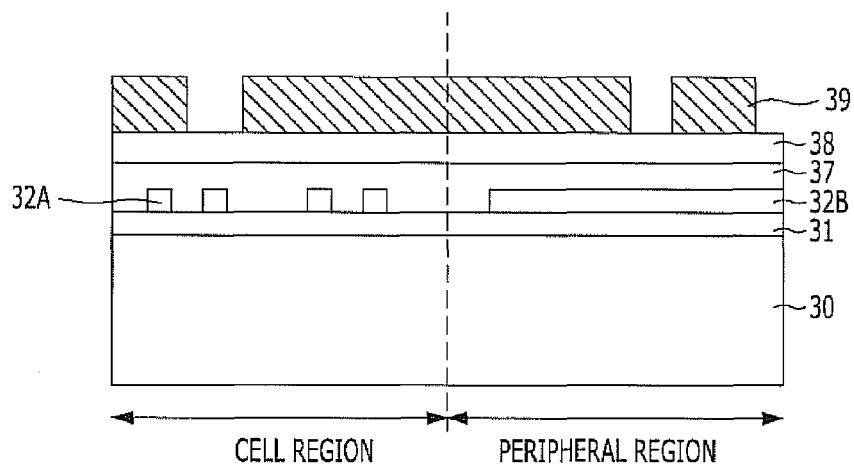
Figure 2L:
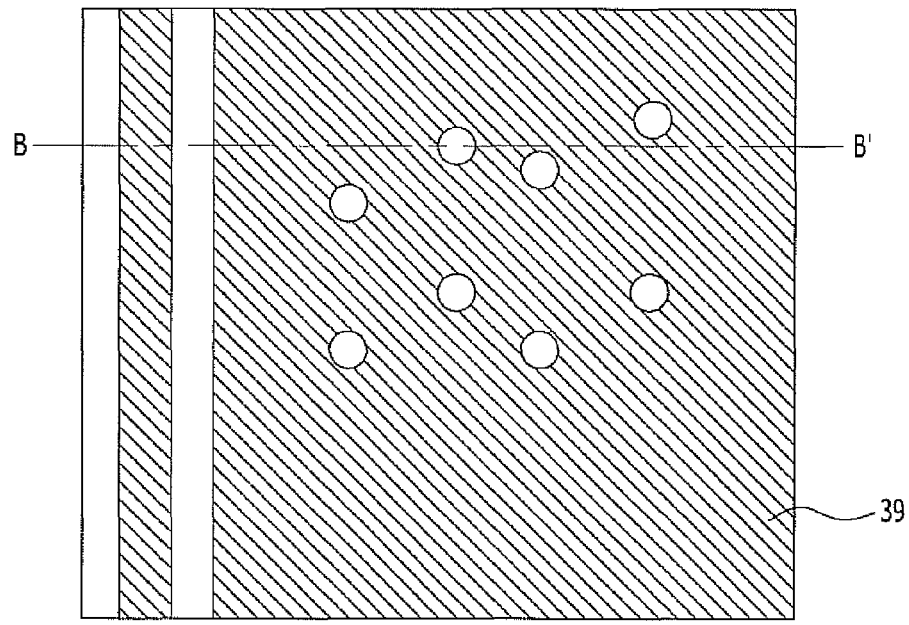

Referring to FIGS. 2K and 2L, a planarization layer 37 may be formed over the substrate structure including the polysilicon patterns 32A and 32B. The planarization layer 37 is formed to planarize the profile of the cell region which includes step heights obtained from patterning. The planarization layer 37 may be formed of any reasonably suitable material for planarization. For example, the planarization layer 37 may be formed of a spin-on-coating (SOC) layer or a spin-on-dielectric (SOD) layer. Particularly, the planarization layer 37 may be formed thicker than the polysilicon layer pattern 32B so as to sufficiently planarize the profile.

Subsequently, a second anti-reflection layer 38 is formed over the planarization layer 37. The second anti-reflection layer 38 may be a silicon anti-reflection coating layer (Si-ARC) which includes silicon and functions as a hard mask, or an anti-reflection layer.

According to another embodiment, the second anti-reflection layer 38 may be directly formed over the polysilicon patterns 32A and 32B without forming the planarization layer 37 so that the second anti-reflection layer 38 functions as a planarization layer.

Subsequently, a third photoresist layer pattern 39 is formed over the second anti-reflection layer 38. The third photoresist layer pattern 39 is a cut mask pattern which cuts the polysilicon layer pattern 32A so that the polysilicon patterns 32A and 32B define active regions in both the cell region and the peripheral region. As illustrated in the plan view of FIG. 2L, the third photoresist layer pattern 39 is formed to open a contact hole pattern in the cell region and define pattern in a line type in the peripheral region. Herein, since the third photoresist layer pattern 39 is etched to create contact holes in the polysilicon layer pattern 32A at the cell region, where the polysilicon layer pattern 32A is formed in a line type and define the active regions, the upper portion of the polysilicon layer pattern 32A in the cell region and an open region of the contact hole pattern may overlap.

In forming the third photoresist layer pattern 39, an immersion lithography process may be performed.

Figure 2M:
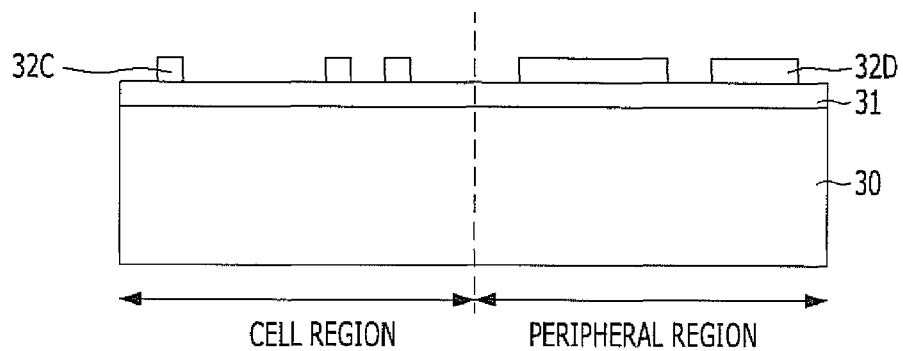
Figure 2N:
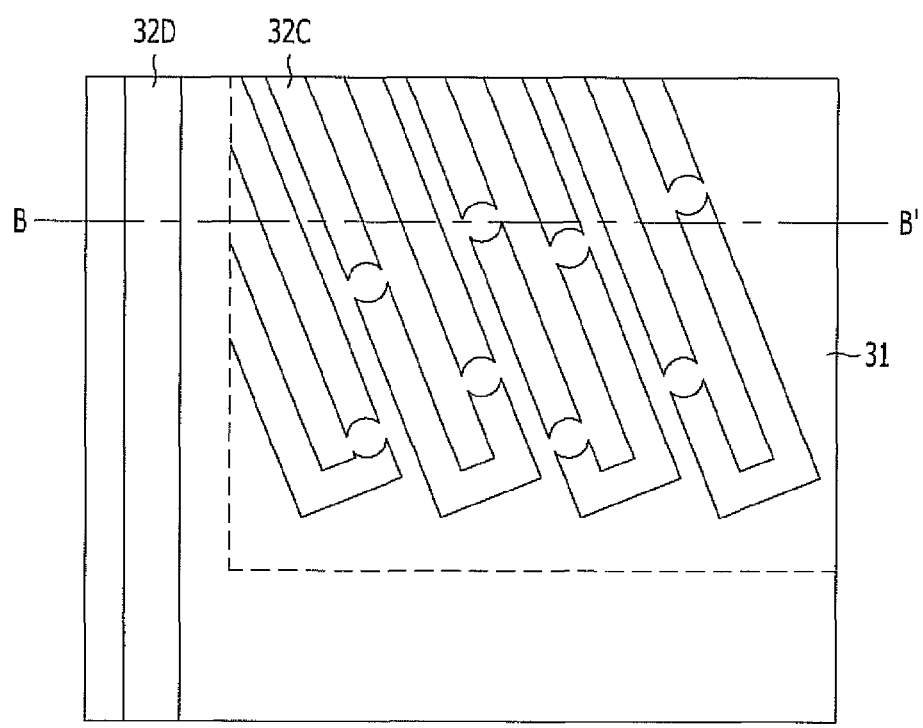

Referring to FIGS. 2M and 2N, the second anti-reflection layer 38 (shown in FIGS. 2K and 2L) and the planarization layer 37 (shown in FIGS. 2K and 2L) are etched using the third photoresist layer pattern 39 (shown in FIGS. 2K and 2L) as an etch barrier.

Subsequently, final polysilicon patterns 32C and 32D are formed by etching the polysilicon layer pattern 32A (shown in FIGS. 2K and 2L) in the cell region and the polysilicon layer pattern 32B (shown in FIGS. 2K and 2L) in the peripheral region.

As illustrated in FIG. 2N, which is a plan view, the final polysilicon pattern 32C in the cell region is divided by the third photoresist layer pattern 39 (shown in FIGS. 2K and 2L)

so as to define active regions, and the final polysilicon pattern 32D in the peripheral region also defines active regions for forming an isolation layer.

Figure 2O:
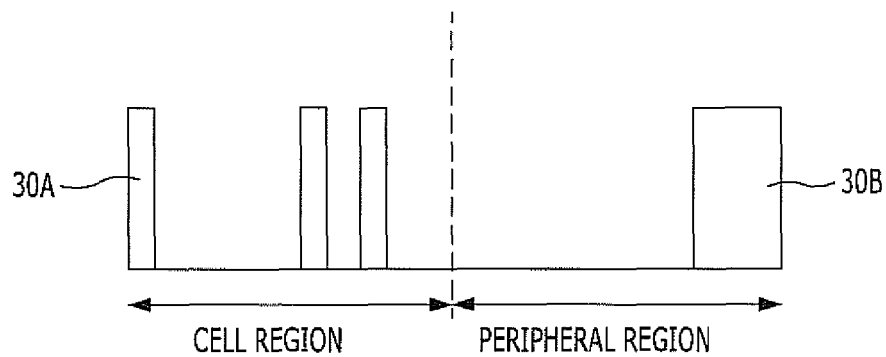
Figure 2P:
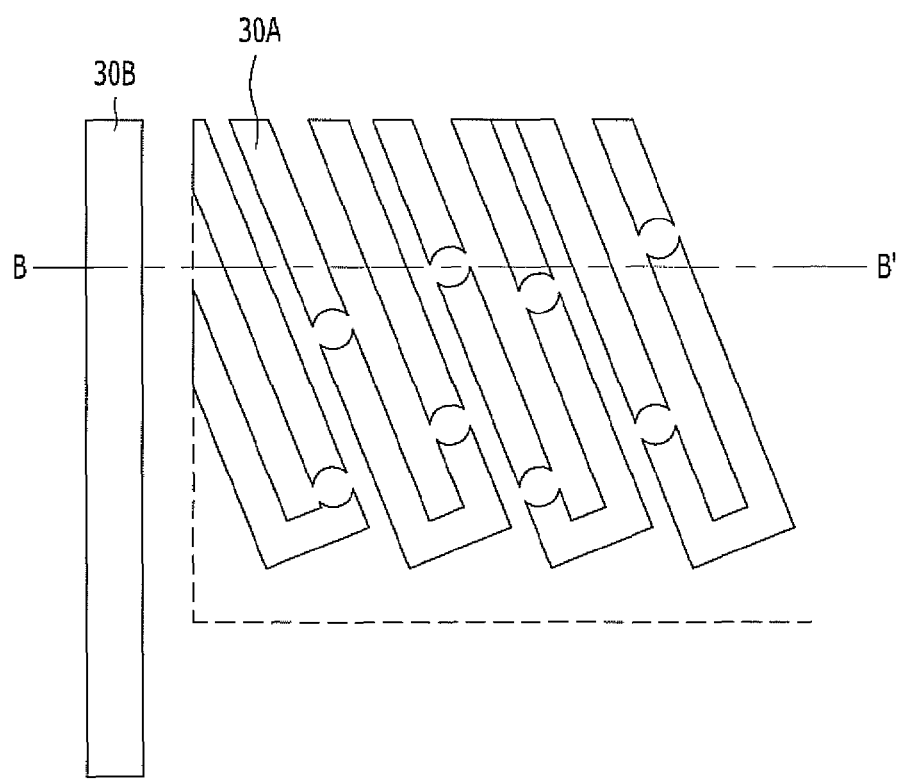

Referring to FIGS. 2O and 2P, the silicon oxynitride layer 31 (shown in FIGS. 2M and 2N) and the etch target layer 30 (shown in FIGS. 2M and 2N) are etched using the final polysilicon patterns 32C and 32D (shown in FIGS. 2M and 2N) as etch barriers so as to form patterns 30A and 30B which define active regions in the cell region and the peripheral region.

While performing the SPT process described above, since the patterning through immersion lithography is performed in two out three processes of forming a photoresist layer, the process margins and mass productivity may be improved. Also, through the positive SPT process, a concern regarding Critical Dimension Uniformity (CDU) failure occurring from a negative SPT process may be alleviated.

The method for forming a fine pattern according to the embodiments of the present invention described above may improve a mask process during an SPT process with respect to production margins and mass productivity.

Also, the fine pattern forming method according to the embodiments of the present invention may improve critical dimension uniformity by applying a positive SPT process.

Also, the fine pattern forming method according to the embodiments of the present invention secures a pattern of a normal profile and alleviates a concern regarding misalignment and pattern deformation by removing a spacer pattern after the formation of a hard mask pattern instead of leaving the spacer pattern until a subsequent process is performed.

Furthermore, the fine pattern forming method according to the embodiments of the present invention protects polysilicon of a peripheral region with a cell open mask pattern when a polysilicon layer pattern is formed in a cell region so as to perform an etch process without forming an additional hard mask pattern in a subsequent process and to facilitate the etch process with same etch characteristics.

While the present invention has been described with respect to the specific embodiments, it will be apparent to those skilled in the art that various changes and modifications may be made without departing from the spirit and scope of the invention as defined in the following claims.

What is claimed is:

1. A method comprising:
   forming a hard mask layer over an etch target layer that extends across a first region and a second region;
   forming a sacrificial layer pattern over the hard mask layer of the first region;
   removing the sacrificial layer pattern after forming a spacer pattern on side walls thereof;
   forming preliminary hard mask patterns in the first and second regions by using the spacer pattern as an etch barrier and etching the hard mask layer of the first region, wherein left and right sides of each of the preliminary hard mask patterns are symmetric to each other;
   removing the spacer pattern;
   forming a cut mask pattern over the preliminary hard mask patterns of the first and second regions, wherein the cut mask pattern exposes portions of the preliminary hard mask patterns in the first and second regions, respectively, for subsequent etching;
   forming final hard mask patterns in the first and second regions simultaneously by using the cut mask pattern as an etch barrier and etching the preliminary hard mask patterns of the first and second regions;
   removing the cut mask pattern; and
   forming patterns in the first and second regions, respectively, by using the final hard mask patterns of the first and second regions as an etch barrier and etching the etch target layer.

2. The method of claim 1, wherein the forming preliminary hard mask patterns in the first and second regions comprises:
   forming a mask pattern over the hard mask layer of the second region, wherein the mask pattern exposes the first region; and
   etching the hard mask layer of the first region by using the spacer pattern and the mask pattern.

3. The method of claim 2, wherein the mask pattern is a photoresist layer pattern formed by light exposure using any one light source selected from the group consisting of a I-Line light source, a KrF light source, and an ArF light source.

4. The method of claim 1, wherein the forming of the hard mask layer and the sacrificial layer pattern comprises:
   forming a sacrificial layer over the hard mask layer;
   forming an anti-reflection layer over the sacrificial layer;
   forming a first mask pattern over the anti-reflection layer of the first region; and
   forming the sacrificial layer pattern by using the first mask pattern as an etch barrier and etching sacrificial layer.

5. The method of claim 4, wherein the first mask pattern is formed through an immersion lithography process.

6. The method of claim 1, wherein the hard mask layer is a polysilicon layer or a stacked layer having a silicon oxynitride layer and a polysilicon layer that are stacked together.

7. The method of claim 1, wherein the sacrificial layer pattern is formed of an amorphous carbon layer or a spin-on-carbon (SOC) layer.

8. The method of claim 1, wherein the spacer pattern has an etch selectivity with respect to the sacrificial layer pattern and the hard mask layer.

9. The method of claim 1, wherein the spacer pattern is an oxide layer or a nitride layer.

10. The method of claim 1, wherein the sacrificial layer pattern is a photoresist layer pattern.

11. The method of claim 1, wherein the spacer pattern is a low-temperature oxide layer.

12. The method of claim 1, wherein the forming of the spacer pattern comprises:
    forming an insulation layer for spacer over a profile of the structure including the sacrificial layer pattern; and
    etching the insulation layer for spacer in such a manner that the insulation layer for spacer remains on the sidewalls of the sacrificial layer pattern.

13. The method of claim 12, wherein the insulation layer for spacer is formed through an Atomic Layer Deposition (ALD) process.

14. The method of claim 1, wherein the cut mask pattern is a photoresist layer pattern obtained by performing a patterning process based on immersion lithography.

15. The method of claim 1, wherein the cut mask pattern defines different patterns in the first region and the second region, respectively.

16. The method of claim 1, wherein etching the preliminary hard mask patterns of the first and second regions by using the cut mask pattern as an etch barrier includes etching the preliminary hard mask patterns to develop a hole pattern in the first region, wherein the hard mask layer defines a line pattern in the second region.

17. The method of claim 16, wherein the line pattern defines an active region of the second region.

18. The method of claim 1, further comprising:
forming a planarization layer over the preliminary hard mask patterns of the first and second regions, before the forming of the cut mask pattern.

19. The method of claim 18, wherein the planarization layer is a spin-on-coating (SOC) layer or a spin-on-dielectric (SOD) layer.

20. The method of claim 18, wherein the planarization layer is formed to be thicker than the preliminary hard mask patterns.

21. The method of claim 18, further comprising:
forming an anti-reflection layer over the planarization layer, before the forming of the cut mask pattern.

22. The method of claim 1, wherein the etch target layer is formed of an oxide layer and the oxide layer comprises a tetraethyl orthosilicate (TEOS) layer.

23. The method of claim 1, wherein the first region is a cell region, and the second region is a peripheral region.

* * * * *